United States Patent
Yawata et al.

(10) Patent No.: US 9,250,269 B2
(45) Date of Patent: Feb. 2, 2016

(54) APPARATUS HAVING FEEDBACK LOOPS BETWEEN MULTIPLE PAIRS OF INSTRUMENTATION MODULES

(71) Applicant: Keysight Technologies, Inc., Minneapolis, MN (US)

(72) Inventors: Ken Yawata, Musashino (JP); Masaharu Goto, Hanno (JP); Katsuhito Iwasaki, Hino (JP)

(73) Assignee: Keysight Technologies, Inc., Santa Rosa, CA (US)

( * ) Notice: Subject to any disclaimer, the term of this patent is extended or adjusted under 35 U.S.C. 154(b) by 108 days.

(21) Appl. No.: 14/249,207

(22) Filed: Apr. 9, 2014

(65) Prior Publication Data
US 2015/0293151 A1 Oct. 15, 2015

(51) Int. Cl.
*G01R 31/02* (2006.01)
*G01R 15/00* (2006.01)
*G01R 19/00* (2006.01)

(52) U.S. Cl.
CPC ............... *G01R 15/00* (2013.01); *G01R 19/00* (2013.01)

(58) Field of Classification Search
CPC .......... G01R 15/00; G01R 19/00; G01R 1/00; G01R 31/02; G01R 31/31907; G01R 27/26; G01R 31/31924; G01R 31/28
See application file for complete search history.

(56) References Cited

U.S. PATENT DOCUMENTS

| | | | | |
|---|---|---|---|---|
| 4,807,161 A * | 2/1989 | Comfort | ............ | G01R 31/2637 702/121 |
| 6,140,926 A * | 10/2000 | Hayden | ............ | G08B 29/16 340/2.7 |
| 7,724,017 B2 * | 5/2010 | Zhao | ............ | G01R 31/2621 324/762.01 |
| 2008/0129313 A1 * | 6/2008 | Iwamoto | ............ | G01R 31/31907 324/555 |

OTHER PUBLICATIONS

"HP 4142B Modular DC Source/Monitor Operation Manual", Hewlett Packard, HP Part No. 04142-90010, Printed in Japan, Mar. 1992, Edition 5.

* cited by examiner

*Primary Examiner* — Son Le (57) ABSTRACT

The apparatus includes a frame to accommodate more than two instrumentation modules; a multiplexed bus associated with the frame and including more than two connectors; and a sense instrumentation module and a source instrumentation module mounted in the frame, electrically connected to respective ones of the connectors, and collectively including a communication link, and a circuit path that includes, in series between a sense input and a source output, a sense circuit to generate a sense output signal representing a sensed parameter dependent on a source signal; a feedback controller to generate a control signal in response to the sense output signal; and a source circuit to generate the source signal in response to the control signal. The communication link is in the circuit path, and includes a bus transmitter and a bus receiver each configured to select a channel of the multiplexed bus via which to communicate.

20 Claims, 5 Drawing Sheets

APPARATUS HAVING FEEDBACK LOOPS BETWEEN MULTIPLE PAIRS OF INSTRUMENTATION MODULES

BACKGROUND

Some measurement tasks, such as four-terminal (Kelvin) resistance measurements and the measurement of the threshold voltage of multiple FETs, require that feedback loops be established between more than one source circuit and more than one sense circuit. Currently-available measurement equipment, such as the model 4142B modular DC source/monitor formerly sold by Agilent Technologies, Inc., Santa Clara, Calif., can only establish a feedback loop between a single source circuit and sense circuit, and is therefore unsuitable for performing measurement tasks that require multiple feedback loops.

Accordingly, what is needed is a measurement apparatus in which respective feedback loops can be established within multiple pairs of sense circuits and source circuits.

DETAILED DESCRIPTION

The following description refers to signals. In some examples, the signals are analog signals. In other examples, the signals are digital signals. Some examples have both analog signals and digital signals.

Figure 1A:
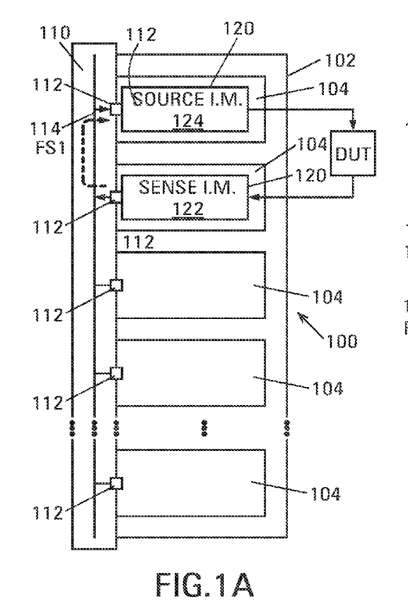
FIG. 1A is a block diagram showing a minimalist example of a measurement apparatus in accordance with the disclosure.

FIG. 1A is a block diagram showing a minimalist example of a measurement apparatus 100 in accordance with the disclosure. Measurement apparatus 100 includes a frame 102, a multiplexed bus 110, a sense instrumentation module 122, and a source instrumentation module 124. Sense instrumentation module 122 and source instrumentation module 124 are referred to herein generically as instrumentation modules 120. The term instrumentation module is abbreviated as I.M. in the drawings. Frame 102 is to accommodate more than two instrumentation modules 120. Multiplexed bus 110 is associated with frame 102, and includes connectors 112 to connect to more than two instrumentation modules 120. In the example shown, sense instrumentation module 122 and source instrumentation module 124 are mounted in respective slots 104 of frame 102 and are connected to multiplexed bus 110 by respective connectors 112. Other ways of mounting instrumentation modules 120 in frame 102 and connecting them to multiplexed bus 110 are known and may be used.

Figure 1B:
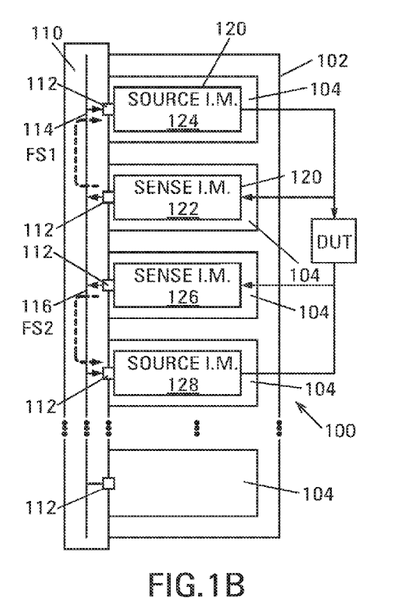
FIG. 1B is a block diagram showing another example of a measurement apparatus in accordance with the disclosure.

FIG. 1B is a block diagram showing another example of measurement apparatus 100 in accordance with the disclosure. The example shown includes additional instrumentation modules 126 and 128 mounted in frame 102. Each of the additional instrumentation modules is connected by a respective connector 112 to multiplexed bus 110. In the example shown, instrumentation module 126 is a sense module, and instrumentation module 128 is a source module. Other examples of measurement apparatus 100 include more or fewer instrumentation modules 120 than the examples shown in FIGS. 1A and 1B. Additionally or alternatively, other examples of measurement apparatus 100 include numbers of sense instrumentation modules and source instrumentation modules different from the examples shown in FIGS. 1A and 1B. In the example shown, sense instrumentation module 126 and source instrumentation module 128 are mounted in respective slots 104 of frame 102. Other ways of mounting additional instrumentation modules 120 in frame 102 are known and may be used.

Sense instrumentation module 122 and source instrumentation module 124 are linked by a first channel 114 of multiplexed bus 110. Instrumentation modules 120 that are linked by a channel of multiplexed bus 110 are said to be paired. Multiplexed bus 110 has N channels. The channel of multiplexed bus 110 used to link two of the instrumentation modules 120 can be selected from any of the N channels of multiplexed bus 110 that are not currently being used to link others of the instrumentation modules 120. A first feedback signal FS1 transmitted via the first channel 114 of the multiplexed bus establishes a first feedback loop between sense instrumentation module 122 and source instrumentation module 124. In the example shown in FIG. 1B, in addition to the link between instrumentation modules 122, 124, a second channel 116 of multiplexed bus 110 links sense instrumentation module 126 to source instrumentation module 128. A second feedback signal FS2 transmitted via the second channel 116 of the multiplexed bus establishes a second feedback loop between sense instrumentation module 126 and source instrumentation module 128. In another example (not shown), a channel of multiplexed bus 110 different from first channel 114 links sense instrumentation module 122 to source instrumentation module 128, and a channel of multiplexed bus 110 different from second channel 116 links sense instrumentation module 126 to source instrumentation module 124. Additional instrumentation modules 120 (not shown) may be mounted in frame 102, and pairs of them may be linked by respective channels (not shown) of multiplexed bus 110. Thus, in measurement apparatus 100, a feedback loop is established via a channel of multiplexed bus 110 between two instrumentation modules, e.g., instrumentation modules 122 and 124, mounted in frame 102, as shown in FIG. 1A. Additionally, when additional instrumentation modules, e.g., instrumentation modules 126 and 128, are mounted in frame 102, multiple feedback loops are established through respective channels of multiplexed bus 110 between pairs of the instrumentation modules.

In some embodiments, instrumentation modules 120 are truly modular, i.e., the instrumentation modules are all physically distinct from one another. In other embodiments, multiple instrumentation modules 120 are fabricated on a common substrate, e.g., a printed circuit board, and/or share a common housing, that constitutes part of measurement apparatus 100. In an example, multiple sense instrumentation modules 122 are fabricated on a common substrate and/or share a common housing. In another example, multiple source instrumentation modules 124 are fabricated on a common substrate and/or share a common housing. In yet another example, one or more sense instrumentation modules 122 and one or more source instrumentation modules 124 are fabricated on a common substrate and/or share a common housing. In some examples in which multiple instrumentation modules 120 are fabricated on a common substrate and/or share a common housing, the common substrate or common housing occupies a single slot 104 of frame 102. In other examples in which multiple instrumentation modules 120 are fabricated on a common substrate and/or share a common housing, the common substrate or common housing occupies more than one slot 104 of frame 102. When multiple instrumentation modules 120 fabricated on a common substrate and/or sharing a common housing are paired, the instrumentation modules are linked by a feedback signal transmitted via a respective channel of multiplexed bus 110.

Figure 2:
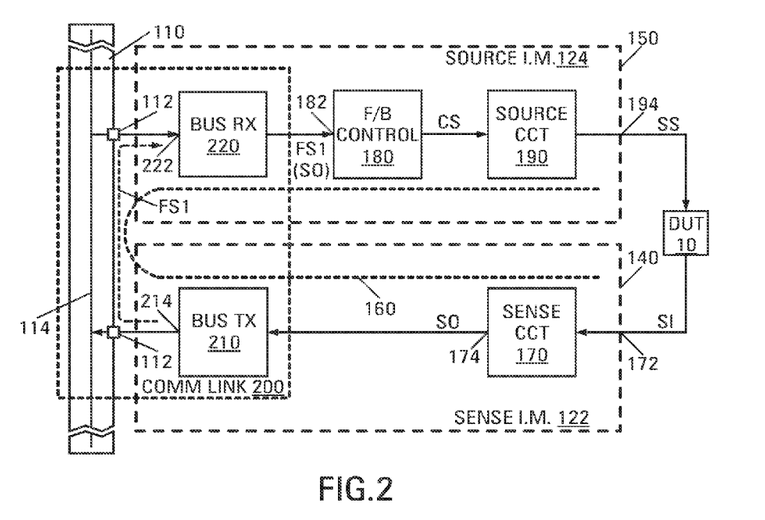
FIGS. 2, 3, and 4 are block diagrams showing respective examples of the sense instrumentation module and source instrumentation module of the measurement apparatus shown in FIG. 1A or FIG. 1B.
Figure 3:
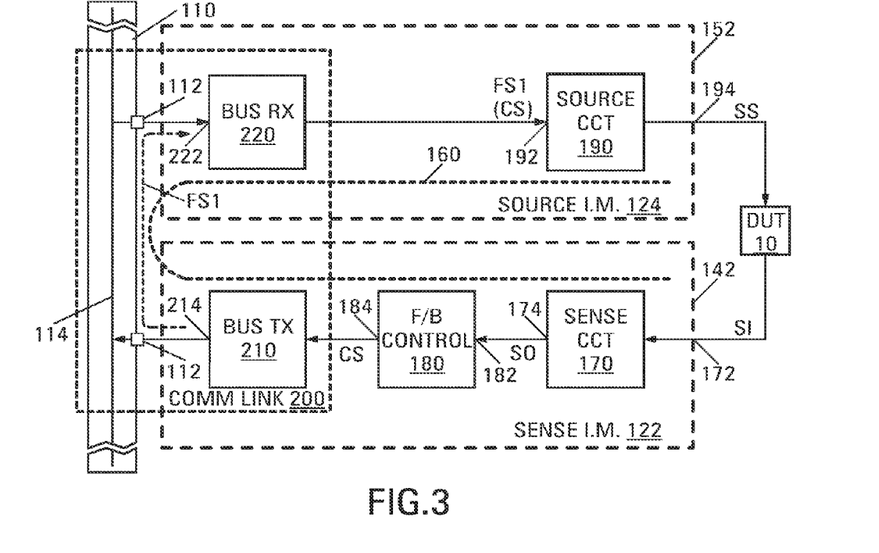
Figure 4:
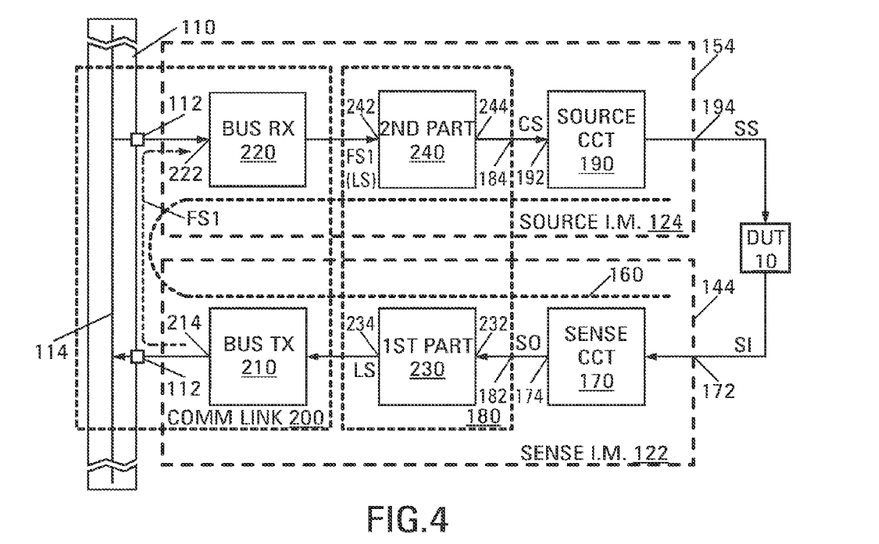

FIGS. 2, 3, and 4 are block diagrams showing respective examples of sense instrumentation module 122 and source instrumentation module 124 of measurement apparatus 100. Multiplexed bus 110 is additionally shown. FIG. 2 shows an example 140 of sense instrumentation module 122 and an example 150 of source instrumentation module 124. FIG. 3 shows another example 142 of sense instrumentation module 122 and another example 152 of source instrumentation module 124. FIG. 4 shows yet another example 144 of sense instrumentation module 122 and yet another example 154 of source instrumentation module 124. In the examples shown, the first channel 114 of multiplexed bus 110 links sense instrumentation module 140, 142 or 144 to source instrumentation module 150, 152, or 154, respectively. In other examples (not shown), a channel of multiplexed bus 110 different from first channel 114 links sense instrumentation module 140, 142 or 144 to source instrumentation module 150, 152, or 154, respectively. Elements of sense instrumentation modules 142, 144 that correspond to elements of sense instrumentation module 140 are indicated using the same reference numerals and will not be individually described. Elements of source instrumentation modules 152, 154 that correspond to elements of source instrumentation module 150 are indicated using the same reference numerals and will not be individually described.

The examples of sense instrumentation module 122 and source instrumentation module 124 shown in FIGS. 2-4 are described as follows. Sense instrumentation module 122 and source instrumentation module 124 collectively include a circuit path 160 that includes a sense circuit 170, a feedback controller 180, a source circuit 190, a sense input 172 and a source signal output 194. Sense circuit 170, feedback controller 180, and source circuit 190 are coupled, in order, in series, between sense input 172 and source signal output 194. Sense circuit 170 is to generate a sense output signal SO representing a sensed parameter dependent on a source signal SS. Feedback controller 180 is to generate a control signal CS in response to sense output signal SO. Source circuit 190 is to generate source signal SS in response to control signal CS. Sense instrumentation module 122 and source instrumentation module 124 additionally collectively include a communication link 200 in circuit path 160. Communication link 200 includes a bus transmitter 210 and a bus receiver 220. Bus transmitter 210 and bus receiver 220 are each configured to select a channel of the multiplexed bus via which to communicate. In the example shown, bus transmitter 210 and bus receiver 220 communicate with one another via first channel 114 of the multiplexed bus. In another example, bus transmitter 210 and bus receiver 220 communicate with one another via another channel of the multiplexed bus. In yet other examples, bus transmitter 210 communicates with the bus receiver (not shown) of a source instrumentation module (not shown) different from source instrumentation module 124 via one channel of multiplexed bus 110, and bus receiver 220 communicates with the bus transmitter (not shown) of a sense instrumentation module (not shown) different from sense instrumentation module 122 via another channel of multiplexed bus 110. In all the examples shown in FIGS. 2-4, sense circuit 170 and bus transmitter 210 are parts of sense instrumentation module 122, and bus receiver 220 and source circuit 190 are parts of source instrumentation module 124.

In the example shown in FIG. 2, feedback controller 180 is wholly located in source instrumentation module 124, and communication link 200 links the sense output 174 of sense circuit 170 to the input 182 of feedback controller 180. Examples of feedback controller 180 are described below with reference to FIGS. 11A and 11B. Sense circuit 170 generates sense output signal SO in response to a sense input signal SI received at sense input 172. In this example, communication link 200 receives sense output signal SO output at the sense output 174 of sense circuit 170, transmits the sense output signal via the first channel 114 of multiplexed bus 110, and outputs sense output signal SO to the input 182 of feedback controller 180. Thus, in this example, sense output signal SO is transmitted as feedback signal FS1. Feedback controller 180 generates control signal CS in response to a sense reference SR (FIGS. 11A, 11B), and sense output signal SO received from sense circuit 170 via communication link 200. Source circuit 190 operates in response to control signal CS received directly from the output 184 of feedback controller 180 to generate source signal SS. Control signal CS generated in response to feedback signal FS1 causes source circuit 190 to generate source signal SS such that sense output signal SO (which depends on source signal SS) generated by sense circuit 170 has a predetermined level or value.

In the example shown in FIG. 3, feedback controller 180 is wholly located in sense instrumentation module 122, and communication link 200 links the output 184 of feedback controller 180 to the control signal input 192 of source circuit 190. Examples of feedback controller 180 are described below with reference to FIGS. 11A and 11B. Sense circuit 170 generates sense output signal SO in response to sense input signal SI. Feedback controller 180 generates control signal CS in response to sense reference SR (FIGS. 11A, 11B), and sense output signal SO received directly from sense circuit 170 at its input 182. In this example, communication link 200 receives control signal CS output at the output 184 of feedback controller 180, transmits the control signal via the first channel 114 of multiplexed bus 110, and outputs control signal CS to the control signal input 192 of source circuit 190. Thus, in this example, control signal CS is transmitted as feedback signal FS1. Source circuit 190 operates in response to control signal CS received from feedback controller 180 via communication link 200 to generate source signal SS. The feedback provided by feedback signal FS1 causes source circuit 190 to generate source signal SS such that sense output signal SO (which depends on source signal SS) generated by sense circuit 170 has a predetermined level or value.

In the example shown in FIG. 4, part of feedback controller 180 is located in sense instrumentation module 144, part of feedback controller 180 is located in source instrumentation module 154, and communication link 200 links the parts of feedback controller 180. In the example shown, feedback controller 180 includes a first part 230 located in sense instrumentation module 144 and a second part 240 located in source instrumentation module 154. First part 230 includes a first part input 232 connected via the input 182 of feedback controller 180 to the sense output 174 of sense circuit 170, and a first part output 234 connected to the bus transmitter 210 of communication link 200. Second part 240 includes a second part input 242 connected to the bus receiver 220 of communication link 200, and a second part output 244 connected via the output 184 of feedback controller 180 to the control signal input 192 of source circuit 190. Sense circuit 170 generates sense output signal SO in response to sense input signal SI. The first part 230 of feedback controller 180 generates a link signal LS in response to sense output signal SO. In this example, communication link 200 receives link signal LS output at the first part output 234 of the first part 230 of feedback controller 180, transmits the link signal via the first channel 114 of multiplexed bus 110, and outputs link signal LS to the second part input 242 of the second part 240 of feedback controller 180. Thus, in this example, link signal LS is transmitted as feedback signal FS1. The second part 240 of feedback controller 180 generates control signal CS in response to link signal LS. Source circuit 190 operates in response to control signal CS received from feedback controller 180 to generate source signal SS. The feedback provided by feedback signal FS1 causes source circuit 190 to generate source signal SS such that sense output signal SO (which depends on source signal SS) generated by sense circuit 170 has a predetermined level or value.

Some examples of measurement apparatus 100 include multiple instances of sense instrumentation module 140 and multiple instances of source instrumentation module 150 described above with reference to FIG. 2. Other examples of measurement apparatus 100 include multiple instances of sense instrumentation module 142 and multiple instances of source instrumentation module 152 described above with reference to FIG. 3. Other examples of measurement apparatus 100 include multiple instances of sense instrumentation module 144 and multiple instances of source instrumentation module 154 described above with reference to FIG. 4. In these examples, any one of the source instrumentation modules may be linked by a respective channel of multiplexed bus 110 to any one of the sense instrumentation modules. Other examples of measurement apparatus 100 include one or more instances of sense instrumentation module 140 and source instrumentation module 150, and one or more instances of sense instrumentation module 142 and source instrumentation module 152 and/or one or more instances of sense instrumentation module 144 and source instrumentation module 154. In these examples, any one the instances of sense instrumentation module 140 may be linked to any one of the instances of source instrumentation module 150, but not to any of the instances of source instrumentation modules 152, 154. Similarly, any one the instances of sense instrumentation module 142 may be linked to any one of the instances of source instrumentation module 152, but not to any of the instances of source instrumentation modules 150, 154, and any one the instances of sense instrumentation module 144 may be linked to any one of the instances of source instrumentation module 154, but not to any of the instances of source instrumentation modules 150, 152.

FIGS. 2-4 each show sense instrumentation module 122 and source instrumentation module 124 connected to respective ports of a device under test (DUT) 10, and to respective connectors 112 of multiplexed bus 110. Specifically, source circuit 190 outputs source signal SS to DUT 10 via source signal output 194. A property, such as voltage, current, frequency, or intensity, of source signal SS output by source circuit 190 is determined by control signal CS received directly or indirectly from the output 184 of feedback controller 180. Additionally, a property, such as voltage, current, frequency, or intensity, of sense input signal SI received at the sense input 172 of sense circuit 170 depends on source signal SS and a property of DUT 10. Sense circuit 170 generates sense output signal SO in response to sense input signal SI received at sense input 172.

As will be described in more detail below with reference to FIG. 9A, some examples of sense circuit 170 include a measurement circuit (not shown) to measure a property of a device under test that depends on source signal SS output by source circuit 190. Examples of sense circuit 170 include respective measurement circuits to measure any physical, chemical or biological parameter that is capable of measurement and of being represented by an analog or digital sense output signal SO. Examples of such parameters include voltage, current, electrostatic capacitance, frequency, intensity, and temperature. Additionally, as will be described in greater detail below with reference to FIG. 10A, some examples of source circuit 190 include respective signal sources to generate source signal SS. Examples of the properties of source signal SS that can be determined by source circuit 190 include voltage, current, frequency and intensity.

In communication link 200, bus transmitter 210 additionally includes a transmitter output 214 at which the bus transmitter outputs feedback signal FS1 to the channel (e.g., first channel 114) of multiplexed bus 110 selected to link sense instrumentation module 122 and source instrumentation module 124, and bus receiver 220 additionally includes a receiver input 222 at which the bus receiver receives feedback signal FS1 from the selected channel of the multiplexed bus.

Multiplexed bus 110 is multiplexed in the sense that multiple feedback signals FS1, FS2, etc., share a common information signal path. Examples of the information signal path include, but are not limited to, a physical signal path, such as an electrical conductor, e.g., a wire or a printed circuit board trace, or an optical fiber, or a wireless signal path, such as a modulated RF carrier or a modulated optical signal. The information signal path is divided into multiple channels, each of which carries a respective feedback signal. Instrumentation modules 120 are configurable so that any two of them can be linked by a selected channel of the signal path. Two instrumentation modules are linked by assigning the bus transmitter 210 of one of them and the bus receiver 220 of the other of them to the same unoccupied channel of multiplexed bus 110. Channel assignment can be done, for example, by a user setting respective channel select controls on the instrumentation modules. More typically, channel assignment is done using administration software that allows the user or higher-level software to identify the instrumentation modules that are to be linked. Then, in response to the identification input, the administration software automatically assigns the instrumentation modules that are to be linked to the same unoccupied channel of the multiplexed bus by transmitting configuration data via a separate signal path of the multiplexed bus or via a channel of the multiplexed bus assigned for this purpose.

Figure 5:
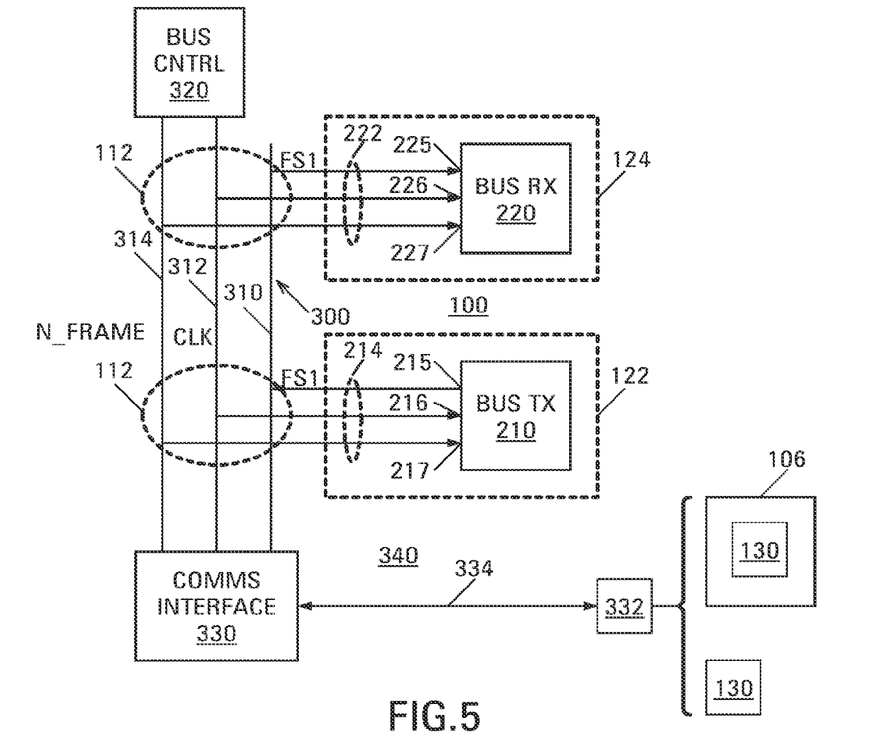
FIG. 5 is a schematic drawing showing an example of a multiplexed bus implemented with time-division multiplexing.

FIG. 5 is a schematic drawing showing an example 300 of multiplexed bus 110 implemented with time-division multiplexing. The example of multiplexed bus 300 shown links sense instrumentation module 122 to source instrumentation module 124. Multiplexed bus 300 includes an information signal path 310, a clock signal path 312, a frame signal path 314 and a bus controller 320. Bus controller 320 generates a clock signal CLK for output on clock signal path 312, and divides the clock signal by an integer to generate a frame signal (FRAME_N) for output on frame signal path 314. Frame signal FRAME_N includes a periodic transition that indicates the start of each frame. In an example in which multiplexed bus 300 has N channels, each channel is a time slot having a duration 1/N of the period of frame signal FRAME_N.

In sense instrumentation module 122, the transmitter output 214 of bus transmitter 210 includes a feedback signal output 215, a clock signal input 216 and a frame signal input 217. Transmitter output 214 is connected to multiplexed bus 300 by a respective connector 112. Feedback signal output 215 is connected to output feedback signal FS1 to information signal path 310, clock signal input 216 is connected to receive clock signal CLK from clock signal path 312, and frame signal input 217 is connected to receive frame signal FRAME_N from frame signal path 314. In source instrumentation module 124, the receiver input 222 of bus receiver 220 includes a feedback signal input 225, a clock signal input 226 and a frame signal input 227. Receiver input 222 is connected to multiplexed bus 300 by a respective connector 112. Feedback signal input 225 is connected to receive feedback signal FS1 from information signal path 310, clock signal input 226 is connected to receive clock signal CLK from clock signal path 312, and frame signal input 227 is connected to receive frame signal FRAME_N from frame signal path 314.

Bus transmitter 210 and bus receiver 220 are synchronized to clock signal CLK received from bus controller 320 via clock signal path 312. Information signal path 310 is shared among all the instrumentation modules 120 connected to multiplexed bus 110. Each linked pair of instrumentation modules is assigned its own channel, i.e., a time slot having a duration 1/N of the period of frame signal FRAME_N. Each bus transmitter, e.g., bus transmitter 210, and each bus receiver, e.g., bus receiver 220, counts the cycles of clock signal CLK to determine the start of the time slot of the respective channel assigned to it. A bus transmitter to which channel n is assigned transmits feedback signal FSn only during the time slot assigned to channel n. The bus receiver paired with the bus transmitter monitors information signal path 310 continuously, but receives and demodulates feedback signal FSn on the information signal path only during the time slot assigned to channel n. This way, the bus receiver receives and demodulates the feedback signal transmitted by the bus transmitter with which it is paired.

In other examples, multiplexed bus 110 lacks frame signal path 314, and bus controller 320 indicates the start of each frame by modulating clock signal CLK.

In another example, multiplexed bus 110 is implemented with frequency-division multiplexing. In this, each of the feedback signals FS1 . . . FSN is transmitted by modulating a respective RF carrier or optical carrier that is transmitted via information signal path 310. Any of the common modulation schemes may be used. Each channel of multiplexed bus 110 has a respective RF carrier frequency or optical carrier wavelength assigned to it. A channel of multiplexed bus 110 is assigned to a pair of instrumentation modules by assigning the RF frequency or optical wavelength of the channel to the pair. The bus transmitter transmits the feedback signal by modulating the RF signal of the assigned RF frequency or the optical carrier of the assigned optical wavelength, and the bus receiver receives the feedback signal by tuning to the assigned RF frequency or optical wavelength. Frequency-division multiplexing is particularly convenient in an analog system, in which the various signals that are transmitted as the feedback signal are analog signals.

In another example, multiplexed bus 110 is implemented with code-division multiplexing. In this, each of the N channels of multiplexed bus 110 has a respective unique code assigned to it. Each of the feedback signals FS1 . . . FSN is transmitted by modulating the feedback signal with one of the N unique codes, and the coded signal is imposed on information signal path 310. A channel of multiplexed bus 110 is assigned to a pair of instrumentation modules by assigning the code for the channel to which the pair is assigned. The bus transmitter transmits the feedback signal by multiplying the feedback signal by the code for the channel, and the bus receiver receives the feedback signal by multiplying the signal received from the information signal path by the code for the channel, which decodes the feedback signal. Various other coding schemes are known and may be used to transmit N feedback signals via fewer than N information signal paths.

For the feedback loop between sense instrumentation module 122 and source instrumentation module 124 to be stable, the transmission latency between sense input 172 and source signal output 194 via multiplexed bus 110 should be much smaller than the reciprocal of the loop bandwidth. The transmission latency includes (1) the delay time of source circuit 190, (2) any delay time between source signal output 194 and the input of DUT 10 (FIG. 1A), (3) any delay time within DUT 10, (4) any delay time between DUT 10 and sense input 172, (5) the delay time of sense circuit 170, (6) the delay time of feedback controller 180, and (7) the delay time of communication link 200, including modulation by bus transmitter 210, signal transfer via multiplexed bus 110, and demodulation by bus receiver 220. In accordance with classical control theory, considering the transfer function of the whole feedback loop from the output 184 of feedback controller 180 to the input 182 of the feedback controller, the delay time must be smaller than 180 degrees at the unity gain frequency. When feedback controller 180 includes an integrator, as is the case when feedback controller 180 includes a PI controller or a PID controller, the integrator itself has a 90° phase delay, so the sum of the remaining delay times must be less than 90°. Assuming that delay times 1, 2, 3, 4, and 5 are negligibly small, then the total delay time $T_{delay}$, i.e., the delay time of communication link 200 and the delay time of the remainder of feedback controller 180, must be less than 90°. One cycle at a frequency of K Hz corresponds to 360°, where K Hz is the loop bandwidth. For the feedback loop to be stable, total delay time $T_{delay}$ should be smaller than $(1/K) \times (90°/360°)$, i.e.:

$$T_{delay} < (1/K) \times (¼).$$

Expressed in words, the total delay time should be less than one-fourth of the reciprocal of the loop bandwidth.

In addition, the bandwidth of each channel of multiplexed bus 110 should be a few times, L, larger than the loop bandwidth K Hz. In an example in which the feedback signal is a digital signal, M is the number of bits per sample transmitted in each channel of multiplexed bus 110, P is the number of bits allocated to each channel for communication overhead, N is the number of channels in multiplexed bus 110, and BR is the bit rate of multiplexed bus 110. Bit rate BR should satisfy the following:

$$BR > (N \ast L \ast K)(M+P) \text{ Hz}$$

In an example, L=2. In other examples, L is greater than or less than 2.

In the example shown in FIGS. 1A and 1B, multiplexed bus 110 and instrumentation modules 120 are mounted in the frame 102 of measurement apparatus 100. In other examples, one or more of the instrumentation modules 120 of measurement apparatus 100 are paired with one or more external instrumentation modules 130 located externally of measurement apparatus 100. In an example, external instrumentation modules 130 are mounted in another measurement apparatus 106 similar to measurement apparatus 100. In another example, external instrumentation modules 130 are stand-alone implementations of the above-described instrumentation modules 120. FIG. 5 additionally shows an example of multiplexed bus 110 that is extended beyond measurement apparatus 100 to a remote location, where measurement apparatus 106 and/or one or more standalone external instrumentation modules 130 are located.

In an example (not shown), the physical structure of multiplexed bus 110 extends to the remote location and connects to the multiplexed bus of measurement apparatus 106 or to the bus transmitter or bus receiver of external instrumentation module 130. In the example shown in FIG. 5, a communication interface 330 is connected to multiplexed bus 110 to extend multiplexed bus 110 to the remote location where another communication interface 332 is located. Communication interfaces 330, 332 are connected using a suitable electrical, optical or wireless connection 334. In various examples, communication interface 330 is a universal serial bus (USB) interface, an Ethernet interface, an optical interface, or a wireless network interface, such as a Wi-Fi or Bluetooth interface. Communication interface 332 is part of, or is connected to, measurement apparatus 106 and/or the one or more standalone external instrumentation modules 130 at the remote location. Any suitable communication technique can be used to link one or more of the instrumentation modules 120 of measurement apparatus 100 to respective remotely-located external instrumentation modules 130 that are stand-alone instrumentation modules or part of another measurement apparatus, for example, measurement apparatus 106, provided that the communication link established using the communication technique between the linked instrumentation modules satisfies the latency and bandwidth requirements described above. Measurement apparatus 100, communication interface 330 and one or more external instrumentation modules 130 collectively constitute a multichannel measurement system 340.

Figure 6:
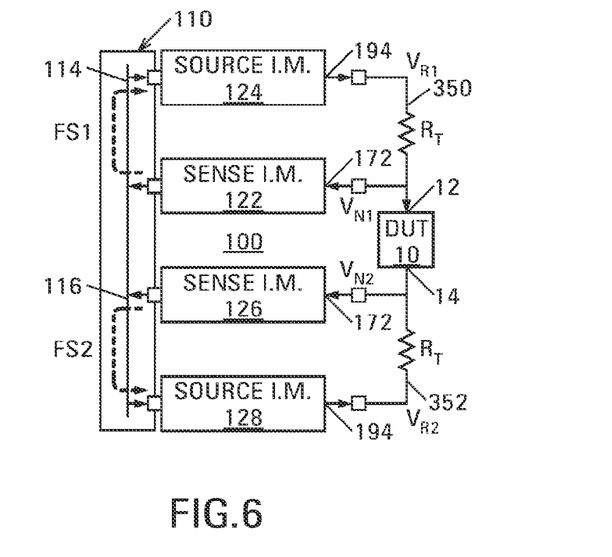
FIG. 6 is a block diagram showing an example of a measurement apparatus as disclosed herein configured to perform a four-terminal (Kelvin) resistance measurement.

FIG. 6 is a block diagram showing an example of measurement apparatus 100 configured to perform a four-terminal (Kelvin) resistance measurement. Such a resistance measurement is performed when the conductors supplying current to the device under test have significant resistance, e.g., resistance comparable with that of the device under test.

In the example shown, measurement apparatus 100 includes a sense instrumentation modules 122, 126 and source instrumentation modules 124, 128. Feedback signal FS1 transmitted from sense instrumentation module 122 to source instrumentation module 124 via the first channel 114 of multiplexed bus 110 establishes a first feedback loop, and feedback signal FS2 transmitted from sense instrumentation module 126 to a source instrumentation module 128 via the second channel 116 of multiplexed bus 110 establishes a second feedback loop. The source signal output 194 of source instrumentation module 124 is connected to a first terminal 12 of DUT 10 via a conductor 350 having a significant resistance $R_T$, and the source signal output 194 of source instrumentation module 128 is connected to a second terminal 14 of DUT 10 via a conductor 352 also having a significant resistance $R_T$. The first terminal 12 and the second terminal 14 of device under test 10 are additionally connected to the sense input 172 of sense instrumentation module 122 and the sense input 172 of sense instrumentation module 126. Source instrumentation module 124 and source instrumentation module 128 apply applied voltages $V_{R1}$ and $V_{R2}$, respectively, to the ends of conductors 350, 352 remote from DUT 10. Sense instrumentation module 122 senses a resulting sense voltage $V_{N1}$ at the first terminal 12 of DUT 10 and generates feedback signal FS1 in response thereto. In response to feedback signal FS1 received from sense instrumentation module 122, source instrumentation module 124 varies applied voltage $V_{R1}$ to set sense voltage $V_{N1}$ to a first specified voltage. The first specified voltage is determined by the value or level of sense reference SR (described below with reference to FIGS. 11A, 11B) located in or received by sense instrumentation module 122 (FIG. 2) or source instrumentation module 124 (FIG. 3 or 4). Additionally, sense instrumentation module 126 senses sense voltage $V_{N2}$ at the second terminal 14 of DUT 10 and generates feedback signal FS2 in response thereto. In response to feedback signal FS2 received from sense instrumentation module 126, source instrumentation module 128 varies applied voltage $V_{R2}$ to set sense voltage $V_{N2}$ to a second specified voltage. The second specified voltage is determined by the value or level of sense reference SR in or received by sense instrumentation module 126 (FIG. 2) or source instrumentation module 128 (FIG. 3 or 4). As a result of the negative feedback applied by feedback signals FS1 and FS2, each of sense voltages $V_{N1}$ and $V_{N2}$ is kept at exactly at its respective specified voltage. Additionally, one of the source modules 124, 128 measures the current output by or received by the respective source module when sense voltages $V_{N1}$, $V_{N2}$ are at their specified levels. The resistance of DUT 10 is then calculated by dividing the difference between sense voltages $V_{N1}$, $V_{N2}$ by the measured current.

Figure 7:
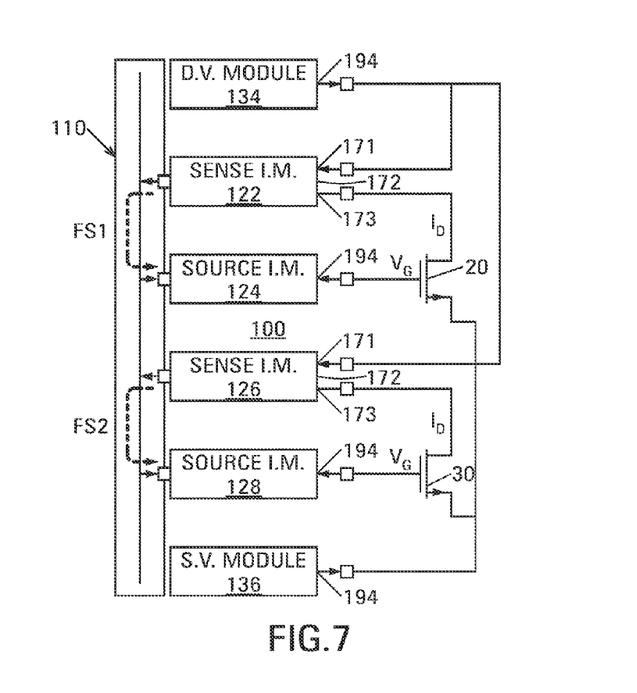
FIG. 7 is a block diagram showing an example of a measurement apparatus as disclosed herein configured to measure respective threshold voltages of multiple FETs concurrently.

FIG. 7 is a block diagram showing an example of measurement apparatus 100 configured to measure respective threshold voltages of multiple FETs concurrently. In the example, only two FETs 20, 30 are shown to simplify the drawing and the following description. In the example shown, measurement apparatus 100 includes sense instrumentation modules 122, 126, and source instrumentation modules 124, 128. Sense instrumentation modules 122, 126 are current sensing instrumentation modules. Source instrumentation modules 124, 128 are voltage source instrumentation modules. Measurement apparatus 100 measures a respective threshold gate-to-source voltage $V_T$ that causes each FET 20, 30 to conduct a defined drain current $I_D$ with a defined drain-to-source voltage $V_{DS}$ applied. Measurement apparatus 100 additionally includes source instrumentation modules 134, 136, both of which are voltage source instrumentation modules. Source instrumentation module 134 defines the drain voltages $V_D$ and source instrumentation module 136 defines the source voltages $V_S$ of all of the FETs whose threshold voltages are to be measured concurrently, i.e., FETs 20, 30 in this example. To clarify the following description, source instrumentation module 134 and source instrumentation module 136 will be referred to as drain voltage (D.V.) module 134 and source voltage (S.V.) module 136, respectively. Specifically, the source signal output 194 of drain voltage module 134 is connected to the drains of FETs 20, 30, and the source signal output 194 of source voltage module 136 is connected to the sources of FETs 20, 30. In another example, measurement apparatus 100 includes a respective instance of drain voltage module 134 and a respective instance of source voltage module 136 for each FET, or a respective instance of drain voltage module 134 and a respective instance of source voltage module 136 for subsets of all the FETs.

In each of sense instrumentation modules 122, 126, sense input 172 includes a current input 171 connected to the source signal output 194 of drain voltage module 134, and a current output 173 connected to the drain of FET 20, 30, respectively. Additionally, in each of sense instrumentation modules 122, 126, the respective bus transmitter 210 (FIG. 2, 3 or 4) is set to transmit respective feedback signal FS1, FS2 via a different channel of multiplexed bus 110. In each of source instrumentation modules 124, 128, source signal output 194 is connected to the gate of FET 20, 30, respectively. Additionally, in each of source instrumentation modules 124, 128, the respective bus receiver 220 (FIG. 2, 3 or 4) is set to receive the respective feedback signal FS1, FS2 from the channel of multiplexed bus 110 via which the respective feedback signal was transmitted by sense instrumentation module 122, 126, respectively.

Figure 11A:
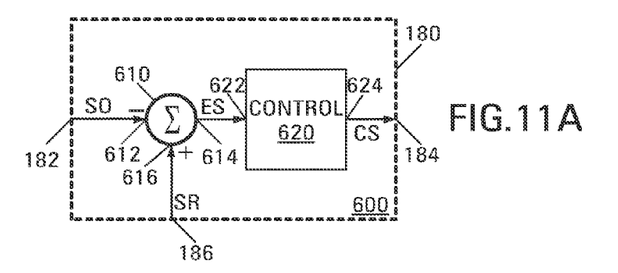
FIG. 11A is a block diagram showing an example of a feedback controller.
Figure 11B:
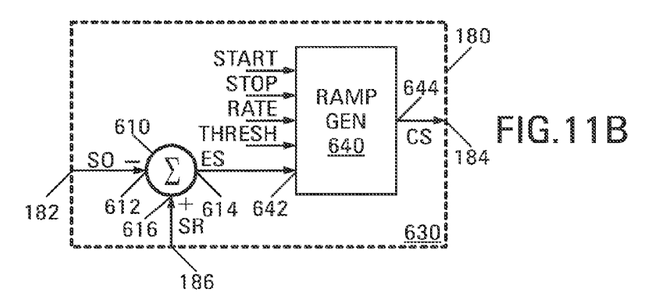
FIG. 11B is a block diagram showing an example of a feedback controller.

Independently of multiplexed bus 110, the respective source circuits 190 (FIG. 2, 3 or 4) of drain voltage module 134 and source voltage module 136 are instructed to generate the defined drain voltage $V_D$ and source voltage Vs under which threshold voltages $V_T$ are to be measured and to output these voltages at their respective source signal outputs 194. Each of sense instrumentation modules 122, 126 measures the respective drain current $I_D$ of FET 20, 30, respectively, and transmits respective feedback signal FS1, FS2 corresponding to the measured drain current to source instrumentation module 124, 128, respectively. In response to the feedback signal, each of source instrumentation modules 124, 128 varies the gate voltage $V_G$ output at its source signal output 194. The feedback process continues until the measured drain current $I_D$ of each FET 20, 30 is equal to a specified drain current. The specified drain current is represented by the level or value of sense reference SR (FIGS. 11A, 11B). Once the measured drain current of each FET 20, 30 is equal to the specified drain current, each source instrumentation module 124, 128 outputs a level or value representing the respective gate voltage $V_G$ output at source signal output 194 of the source instrumentation module as the measured threshold voltage $V_T$ of FET 20, 30, respectively. A version of measurement apparatus 100 equipped with M instances of sense instrumentation module 122, M instances of source instrumentation module 124, one or more drain voltage modules 134, and one or more source voltage modules 136 can measure respective threshold voltages of M FETs concurrently, where M is an integer that can be in the tens, the hundreds, or more.

In the example just described, drain voltage module 134 and source voltage module 136 each output a respective defined voltage, and do not receive a feedback signal from another instrumentation module. In other examples, at least one of drain voltage module 134 and source voltage module 136 receives a feedback signal from another instrumentation module. For example, at least one of drain voltage module 134 and source voltage module 136 receives a feedback signal from another instrumentation module (not shown) that measures the difference between the drain voltage output by drain voltage module 134 and the source voltage output by source voltage module 136, and in which sense reference SR represents a target drain-to-source voltage.

Figure 8:
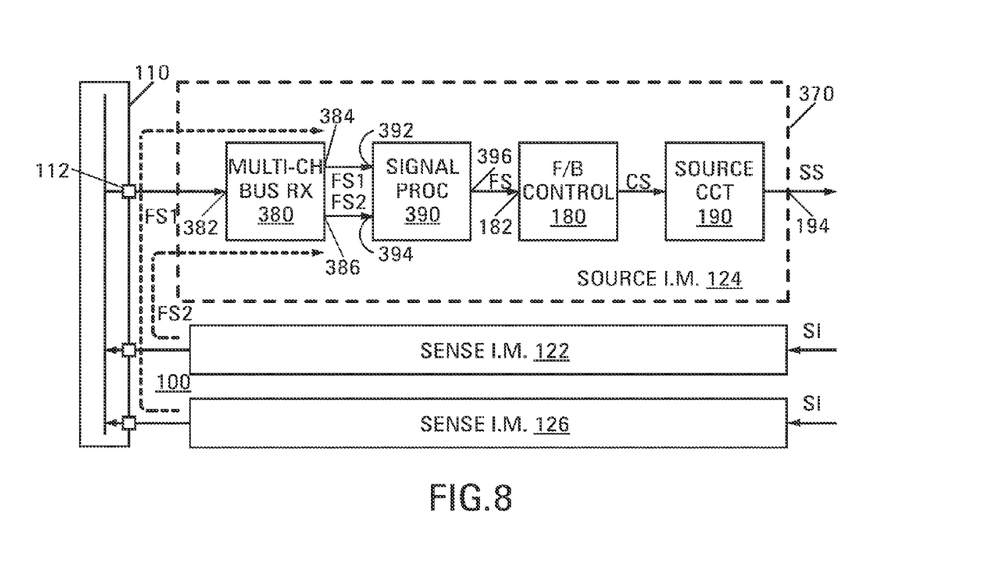
FIG. 8 is a block diagram showing an example of a measurement apparatus as disclosed herein having a source instrumentation module configured to operate in response to respective feedback signals received from two or more sense instrumentation modules.

FIG. 8 is a block diagram showing an example of measurement apparatus 100 having an implementation 370 of source instrumentation module 124 configured to operate in response to respective feedback signals received via different channels of multiplexed bus 110 from two or more sense instrumentation modules. Elements of source instrumentation module 370 that correspond to elements of source instrumentation module 150 described above with reference to FIG. 2 are indicated using the same reference numerals and will not be described again in detail.

The example of source instrumentation module 370 shown includes a multi-channel bus receiver 380, a signal processor 390, feedback controller 180 and source circuit 190. In the example shown, multi-channel bus receiver 380 has a receiver input 382 connected to multiplexed bus 110 by a respective connector 112. Each channel of multi-channel bus receiver 380 is similar to bus receiver 220 described above with reference to FIGS. 2-4. Each channel of multi-channel bus receiver 380 is configured to select any one of the channels of multiplexed bus 110, or any one of a subset of the channels, from which to receive a respective feedback signal. The channels of multi-channel bus receiver 380 are additionally configured to select different channels of multiplexed bus 110 from which to receive their respective feedback signals. Each channel of multi-channel bus receiver 380 includes a respective output at which it outputs a respective feedback signal received from multiplexed bus 110. In the example shown, multi-channel bus receiver 380 is a two-channel bus receiver and includes a first output 384 at which it outputs a feedback signal FS1 received via a first channel of multiplexed bus 110, and a second output 386 at which it outputs a feedback signal FS2 received via a second channel of multiplexed bus 110. In other examples, multi-channel bus receiver 380 has more than two channels and a corresponding number of outputs.

Signal processor 390 is interposed between multi-channel bus receiver 380 and feedback controller 180. In an example in which the feedback signals output by multi-channel bus receiver 380 are analog signals, signal processor 390 is an analog signal processor such as a summing circuit, a differencing circuit, a multiplying circuit, a dividing circuit, a filter circuit, or a mixing circuit. In an example in which the feedback signals output by multi-channel bus receiver 380 are digital signals, signal processor 390 is a digital signal processor programmed to perform functions similar to those just described digitally. Signal processor 390 typically has inputs corresponding in number to the number of channels of multi-channel bus receiver 380. In the example shown, the first output 384 and the second output 386 of multi-channel bus receiver 380 are connected to a first input 392 and a second input 394, respectively, of signal processor 390. Signal processor 390 additionally has an output 396 connected to the input 182 of feedback controller 180. Signal processor 390 processes the feedback signals received by source instrumentation module 370 via respective channels of multiplexed bus 110 to generate a single feedback signal for input to feedback controller 180.

In the example of source instrumentation module 370 shown, multi-channel bus receiver 380 receives a first feedback signal FS1 via one channel of multiplexed bus 110 from sense instrumentation module 122, and receives a second feedback signal FS2 via another channel of multiplexed bus 110 from sense instrumentation module 126. Signal processor 390 processes feedback signals FS1 and FS2 output by multi-channel bus receiver 380 to generate a feedback signal FS for input to feedback controller 180. In an example, sense instrumentation module 122 and sense instrumentation module 126 receive respective sense input signals SI from respective locations in a device under test (not shown) between which a differential signal exists. In source instrumentation module 370, feedback signals FS1 and FS2 received by signal processor 390 from multi-channel bus receiver 220380 represent the sense input signals SI received by sense instrumentation modules 122, 126, respectively. Signal processor 390 subtracts one of the feedback signals FS1, FS2 from the other of the feedback signals to generate single-ended feedback signal FS that is input to feedback controller 180.

Other examples of source instrumentation module 370 include multiple single-channel bus receivers (not shown) instead of multi-channel bus receiver 380. Each of the single-channel bus receivers is similar to bus receiver 220. Each of the single-channel bus receivers is configured to select any one of the channels of multiplexed bus 110, or any one of a subset of the channels, from which to receive a respective feedback signal. The single-channel bus receivers are additionally configured to select different channels of multiplexed bus 110 from which to receive their respective feedback signals. An example of source instrumentation module 370 having multiple single-channel bus receivers includes an instance of connector 112 connected to the receiver input of each single-channel bus receiver to connect source instrumentation module 370 to multiplexed bus 110. Another example of source instrumentation module 370 having multiple single-channel bus receivers includes a single connector 112 for connecting source instrumentation module 370 to multiplexed bus 110. Signals received from the multiplexed bus via the single connector are distributed within instrumentation module to the receiver inputs of the single-channel bus receivers. In yet another example, a subset of the single-channel bus receivers are connected to multiplexed bus 110 via a shared connector 112.

Figure 9A:
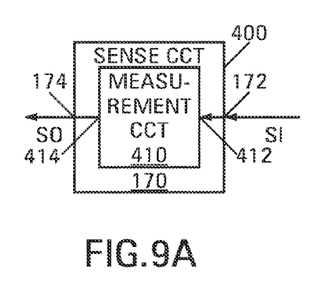
FIGS. 9A and 9B are block diagrams showing respective examples of a sense circuit.

FIG. 9A is a block diagram showing an example 400 of sense circuit 170 that constitutes part of sense instrumentation module 122 (FIG. 2, 3 or 4). In the example shown, sense circuit 400 includes a measurement circuit 410 having a measurement circuit input 412 and a measurement circuit output 414. Measurement circuit input 412 is connected to receive sense input signal SI from the sense input 172 of sense circuit 170. Measurement circuit output 414 is connected to output sense output signal SO generated by measurement circuit 410 to the sense output 174 of the sense circuit. Measurement circuit 410 includes circuitry configured to measure a parameter of a device under test (not shown) represented by sense input signal SI and to generate sense output signal SO. A property of sense output signal SO represents the parameter represented by sense input signal SI. Examples of parameters that can be measured by measurement circuit 410 are described above.

Figure 9B:
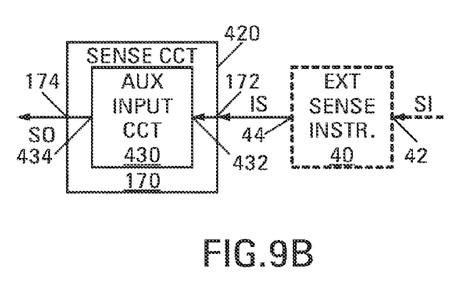

Measurement circuit 410 may be a duplication (in some cases, an inferior duplication) of a sense instrument already in the user's possession, or commercially available for the user to purchase. Modern sense instruments typically include an output port at which is output an analog or digital instrument signal. A property of the instrument signal represents a parameter of a device under test (not shown) sensed by the sense instrument. FIG. 9B is a block diagram showing another example 420 of sense circuit 170 configured for use with an external sense instrument that is external to measurement apparatus 100. In the example shown, sense circuit 420 is connected to an external sense instrument 40. Specifically, sense input 172 of sense circuit 420 is connected to receive an instrument signal IS from an output port 44 of sense instrument 40. Sense instrument 40 additionally has an input port 42 at which it receives sense input signal SI that represents a parameter of a DUT to be sensed by the sense instrument. Sense instrument 40 measures the parameter of the DUT represented by sense input SI and generates instrument signal IS in response thereto.

Sense circuit 420 includes an auxiliary input circuit 430 having an input 432 and an output 434. Input 432 is connected to receive instrument signal IS from the sense input 172 of sense circuit 420. Output 434 is connected to output sense output signal SO generated by auxiliary input circuit 430 to the sense output 174 of the sense circuit. Auxiliary input circuit 430 processes instrument signal IS to generate in response thereto sense output signal SO that is compatible with the sense output signal SO generated by measurement circuit 410 described above with reference to FIG. 9A, or that is otherwise compatible with the feedback controller 180, source circuit 190 and communication link 200 of sense instrumentation module 122 and source instrumentation module 124. Examples of the processing performed by auxiliary input circuit 430 include analog-to-digital or digital-to-analog conversion, resampling, reference changing, dynamic range modification, and frequency range modification.

Figure 10A:
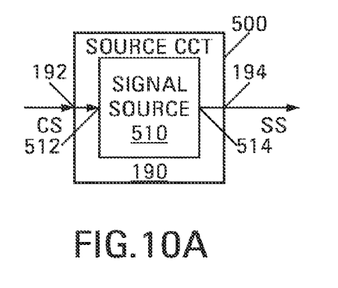
FIGS. 10A and 10B are block diagrams showing respective examples of a source circuit.

FIG. 10A is a block diagram showing an example 500 of source circuit 190 that constitutes part of source instrumentation module 124 (FIG. 2, 3 or 4). In the example shown, source circuit 500 includes a signal source 510 having a signal source input 512 and a signal source output 514. Signal source input 512 is connected to receive control signal CS from the control signal input 192 of source circuit 190. Signal source output 514 is connected to output source signal SS generated by signal source 510 to the source signal output 194 of the source circuit. Signal source 510 includes circuitry (not shown) that operates in response to control signal CS to generate source signal SS on which a measured parameter of a device under test (not shown) connected to receive the source signal depends. Examples of source signals that can be generated by signal source 510 are described above.

Figure 10B:
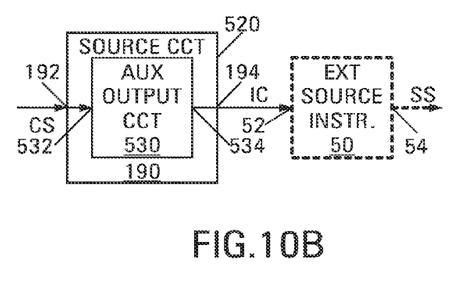

Signal source 510 may be a duplication (in some cases, an inferior duplication) of a source instrument already in the user's possession, or commercially available for the user to purchase. Modern source instruments typically include an external control port to receive an analog or digital instrument control signal that defines a property of a source signal generated by the source instrument. FIG. 10B is a block diagram showing another example 520 of source circuit 190 configured for use with an external source instrument that is external to measurement apparatus 100. In the example shown, source circuit 520 is connected to an external source instrument 50. Specifically, the source signal output 194 of source circuit 520 is connected to output an instrument control signal IC to an instrument control port 52 of source instrument 50. Source instrument 50 additionally has an output port 54 at which it outputs source signal SS on which a sensed parameter of a device under test (not shown) connected to receive the source signal depends. Examples of source signals that can be generated by source instrument 50 are the same as those described above.

Source circuit 520 includes an auxiliary output circuit 530 having an input 532 and an output 534. Input 532 is connected to receive control signal CS from the control signal input 192 of source circuit 520. Output 534 is connected to output instrument control signal IC generated by auxiliary output circuit 530 to the source signal output 194 of the source circuit. Auxiliary output circuit 530 processes control signal CS to generate in response thereto instrument control signal IC compatible with the control parameters of source instrument 50. Examples of the processing performed by auxiliary output circuit 530 include analog-to-digital or digital-to-analog conversion, resampling, reference changing, level changing, dynamic range modification, or frequency range modification.

FIG. 11A is a block diagram showing an example 600 of a feedback controller suitable for use as feedback controller 180 in the above-described instrumentation modules 120. Feedback controller 600 includes a summing circuit 610 in series with a control circuit 620. Summing circuit 610 includes a summing input 612 connected to receive sense output signal SO from the input 182 of feedback controller 180, and error signal output 614, and a sense reference input 616. Sense reference input 616 is connected to receive sense reference SR. In the example shown, sense reference SR is received from a sense reference input 186 of feedback controller 180 via which the sense reference is received from an external sense reference source (not shown). In another example, sense reference SR is received at sense reference input 616 from a sense reference source (not shown) internal to feedback controller 180. Summing circuit 610 subtracts sense output signal SO from sense reference SR to generate an error signal ES that is output at error signal output 614.

In an example, control circuit 620 is implemented as a Proportional-Integral (PI) control circuit. In another example, control circuit 620 is implemented as a Proportional-Integral-Derivative (PID) control circuit. Control circuit 620 includes a control circuit input 622 coupled to receive error signal ES from the error signal output 614 of summing circuit 610, and a control circuit output 624 connected to output control signal CS to the output 184 of feedback controller 180. In some examples, control circuit 620 additionally includes a gain control input (not shown) at which a gain control signal (not shown) is received to set the gain of the control circuit so that the feedback bandwidth can be adjusted.

In some implementations of feedback controller 600, such in implementations suitable for use in instrumentation module 150 shown in FIG. 2 or in instrumentation module 142 shown in FIG. 3, control circuit 620 is located in the same instrumentation module 120 as summing circuit 610, and control circuit input 622 of control circuit 620 is directly connected to receive error signal ES from the error signal output 614 of summing circuit 610. In an implementation suitable for use in instrumentation modules 144, 154 shown in FIG. 4, summing circuit 610 constitutes the first part 230 of feedback controller 180, control circuit 620 constitutes the second part 240 of feedback controller 180, and the control circuit input 622 of control circuit 620 is coupled by communication link 200 to the error signal output 614 of summing circuit 610. In other implementations in which feedback controller 600 is distributed between two instrumentation modules, the partitioning of feedback controller 600 between first part 230 and second part 240 is different from that just described.

Summing circuit 610 subtracts sense output signal SO received directly or via communication link 200 from sense circuit 170 from sense reference SR and outputs error signal ES to control circuit 620 directly or via communication link 200. In the example shown in FIG. 4, error signal ES is transmitted to control circuit 620 as link signal LS. Control circuit 620 then generates control signal CS in response to link signal LS, and outputs the control signal to source circuit 190 via output 184.

FIG. 11B is a block diagram showing another example 630 of a feedback controller suitable for use as feedback controller 180 in the above-described instrumentation modules 120. Feedback controller 630 includes summing circuit 610 and a ramp generator 640. Elements of feedback controller 630 that correspond to elements of feedback controller 600 described above with reference to FIG. 11A are indicated using the same reference numerals, and will not be described again here. Ramp generator 640 includes an error signal input 642 at which the ramp generator receives error signal ES generated by summing circuit 610 by determining the difference between sense reference SR and sense output signal SO received at the input 182 of feedback controller 180 directly or via communication link 200 from sense circuit 170. Ramp generator 640 additionally includes a control signal output 644 at which a ramp generator 640 outputs control signal CS to the output 184 of feedback controller 180. Output 184 is coupled to source circuit 190 directly, or via communication link 200.

Ramp generator 640 additionally includes a START input at which it receives a digital or analog start signal defining a start level or value, a STOP input at which it receives a digital or analog stop signal defining a stop level or value, a RATE input at which it receives a digital or analog rate control signal that defines a rate at which a ramp signal generated by the ramp generator increases or decreases in level or value, and a THRESH input at which it receives a digital or analog threshold signal defining a threshold level or value.

In some implementations of feedback controller 630, such as an implementation suitable for use in instrumentation module 150 shown in FIG. 2 or in instrumentation module 142 shown in FIG. 3, ramp generator 640 is located in the same instrumentation module 120 as summing circuit 610, and the error signal input 642 of ramp generator 640 is directly connected to the error signal output 614 of summing circuit 610. In an implementation suitable for use in instrumentation modules 144, 154 shown in FIG. 4, summing circuit 610 constitutes the first part 230 of feedback controller 180, ramp generator 640 constitutes the second part 240 of feedback controller 180, and the error signal input 642 of ramp generator 640 is coupled by communication link 200 to the error signal output 614 of summing circuit 610. In other implementations in which feedback controller 630 is distributed between two instrumentation modules, the partitioning of feedback controller 630 between first part 230 and second part 240 is different from that just described.

Initially, ramp generator 640 outputs the level or value defined by the level or value defined by the start signal as control signal CS, and then changes (increases or decreases) control signal CS at the rate defined by the rate control signal until the control signal reaches the level or value defined by the stop signal. While generating the ramp signal, ramp generator 640 monitors error signal ES received from summing circuit 610. When the absolute value of the error signal falls below the threshold defined by the threshold signal, the ramp generator stop changing the control signal and holds the control signal at a constant level or value. The level of control signal CS held by ramp generator 640 is that which causes source circuit 190 to generate source signal SS at a level or value that makes sense output signal SO equal to sense reference SR.

This disclosure describes the invention in detail using illustrative embodiments. However, the invention defined by the appended claims is not limited to the precise embodiments described.

We claim:
1. A multichannel measurement apparatus, comprising:
   a frame to accommodate more than two instrumentation modules;
   a multiplexed bus associated with the frame, the bus comprising more than two connectors, each for connection to a respective instrumentation module; and
   a sense instrumentation module and a source instrumentation module mounted in the frame and electrically connected to respective ones of the connectors, the sense instrumentation module and the source instrumentation module collectively comprising:
   a circuit path comprising a sense circuit, a feedback controller, and a source circuit coupled in order in series between a sense input and a source output, the sense circuit to generate a sense output signal representing a sensed parameter dependent on a source signal, the feedback controller to generate a control signal in response to the sense output signal, the source circuit to generate the source signal in response to the control signal; and a communication link in the circuit path, the communication link comprising a bus transmitter and a bus receiver each configured to select a channel of the multiplexed bus via which to communicate; in which:

the sense input, the sense circuit and the bus transmitter are parts of the sense instrumentation module; and the bus receiver, the source circuit and the source output are parts of the source instrumentation module.

2. The apparatus of claim 1, in which the communication link is between the sense circuit and the feedback controller.

3. The apparatus of claim 1 in which the communication link is between the feedback controller and the source circuit.

4. The apparatus of claim 1, in which the communication link is between parts of the feedback controller.

5. The apparatus of claim 4, in which:
the feedback controller comprises a summing circuit and a control circuit in series; and
the communication link is between the summing circuit and the control circuit.

6. The apparatus of claim 1, in which the multiplexed bus comprises a time division multiplexed bus.

7. The apparatus of claim 6, in which the multiplexed bus comprises:
an information signal path, a frame signal path and a clock signal path; and
a bus controller to impose a frame signal on the frame signal path and a clock signal on the clock signal path.

8. The apparatus of claim 1, in which:
the multiplexed bus has a transmission latency;
the apparatus has a feedback bandwidth; and
the transmission latency is less than a reciprocal of the feedback bandwidth.

9. The apparatus of claim 1, in which the multiplexed bus comprises a frequency division multiplexed bus.

10. The apparatus of claim 1, in which the multiplexed bus comprises a code division multiplexed bus.

11. The apparatus of claim 1, in which the feedback controller comprises a ramp generator.

12. The apparatus of claim 1, in which:
the bus transmitter and bus receiver are each configured to select a first channel of the multiplexed bus via which to communicate; and
the apparatus additionally comprises additional instrumentation modules mounted in the frame and comprising an additional bus transmitter and an additional bus receiver each configured to select a second channel of the multiplexed bus via which to communicate.

13. The apparatus of claim 1, in which:
the bus transmitter and the bus receiver are each configured to select a first channel of the multiplexed bus via which to communicate;
the source instrumentation module additionally comprises an additional bus receiver;
the apparatus additionally comprises an additional sense instrumentation module mounted in the frame and comprising an additional bus transmitter, the additional bus transmitter and the additional bus receiver configured to select a second channel of the multiplexed bus via which to communicate; and
the feedback controller is located in the source instrumentation module and comprises a signal processor and a control circuit, the signal processor to subject respective feedback signals received from the sense instrumentation module and from the additional sense instrumentation module to an arithmetic operation prior to input to the control circuit.

14. The apparatus of claim 1, in which the sense instrumentation module and the source instrumentation module are fabricated on a common substrate.

15. The apparatus of claim 1, in which the sense circuit is to generate the sense output signal from an instrument signal received from an external instrument, the instrument signal representing the parameter sensed by the external instrument.

16. The apparatus of claim 1, additionally comprising a communication interface connected to the multiplexed bus.

17. The apparatus of claim 16, additionally comprising one of an electrical, and optical, and a wireless communication path connected to the communication interface.

18. The apparatus of claim 1, in which the source circuit is to generate, in response to the control signal, an instrument control signal for controlling generation of the source signal by an external source instrument.

19. A multichannel measurement system, comprising:
a multichannel measurement apparatus in accordance with claim 1,
a communication interface coupled to the multiplexed bus;
an external instrumentation module external to the multichannel measurement apparatus, the external instrumentation module linked to one of the source instrumentation module and the sense instrumentation module via the communication interface and a channel of the multiplexed bus.

20. The multichannel measurement system of claim 19, in which the external instrumentation module is one of (a) an external sense instrumentation module to receive an instrument signal from an external instrument, the instrument signal representing a parameter sensed by the external instrument, and (b) an external source instrumentation module to output an instrument control signal to control generation of an external source signal by an external source instrument.

* * * * *